United States Patent [19]

Gonzalez

[11] Patent Number: 4,967,158
[45] Date of Patent: Oct. 30, 1990

[54] PORTABLE DETECTOR DEVICE FOR DETECTING PARTIAL ELECTRICAL DISCHARGE IN LIVE VOLTAGE DISTRIBUTION CABLES AND/OR EQUIPMENT

[75] Inventor: Antonio Gonzalez, Greenfield Park, Canada

[73] Assignee: Hydro-Quebec, Montreal, Canada

[21] Appl. No.: 331,293

[22] Filed: Mar. 31, 1989

[51] Int. Cl.$^5$ .................... G01R 31/12; G01R 31/08
[52] U.S. Cl. .................................. 324/536; 455/232; 324/528
[58] Field of Search .............. 324/536, 529, 530, 528; 455/232, 254

[56] References Cited

U.S. PATENT DOCUMENTS

| 3,453,533 | 7/1969 | Cox | 324/529 |
| 4,006,410 | 2/1977 | Roberts | 324/536 |
| 4,775,839 | 10/1988 | Kosina | 324/536 |

FOREIGN PATENT DOCUMENTS

| 2721353 | 11/1978 | Fed. Rep. of Germany | 324/536 |
| 1157140 | 5/1958 | France | 324/529 |
| 524862 | 8/1940 | United Kingdom | 324/536 |
| 2045955 | 11/1980 | United Kingdom | 324/529 |

Primary Examiner—Reinhard J. Eisenzopf
Assistant Examiner—Jose M. Solis
Attorney, Agent, or Firm—Oblon, Spivak, McClelland, Maier & Neustadt

[57] ABSTRACT

A portable detector device for detecting partial electrical discharge in live voltage distribution cables and/or equipment. The device comprises a probe secured to an insulated portable handle for manual displacement of the probe. A detector device is connected to the probe for detecting a signal in the range of 5 to 10 MHz emitted by the partial discharge. The detector has an input attenuator circuit which is connected to the probe to lower the level of the detected signal to a desired level. A transformation circuit is further provided to change the detected signal to a predetermined frequency signal substantially free of noise and representative of the magnitude of the detected partial discharge signal. An amplifier circuit amplifies the predetermined frequency signal and an output circuit generates signals indicative of the presence and magnitude of the partial discharge.

14 Claims, 5 Drawing Sheets

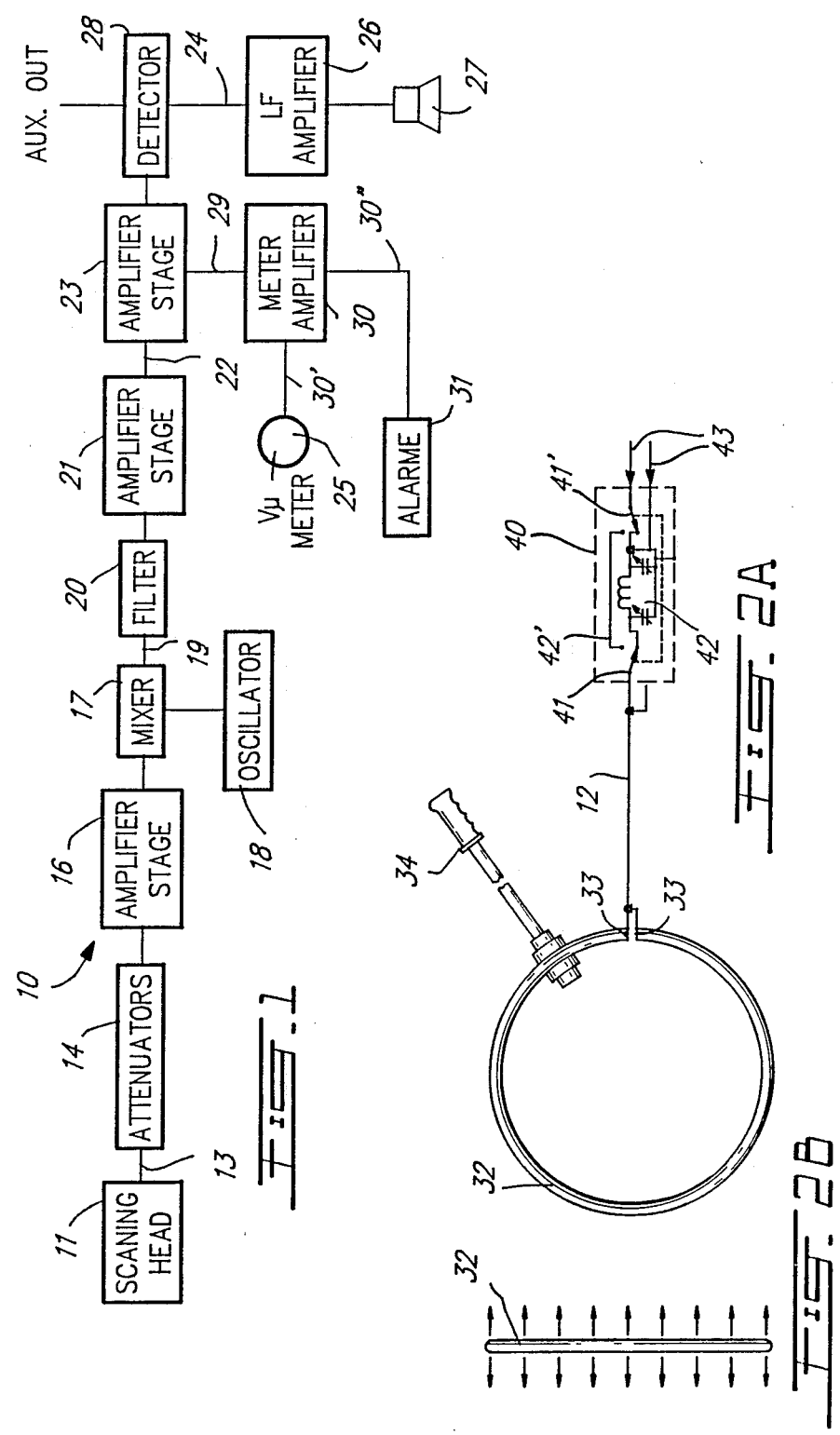

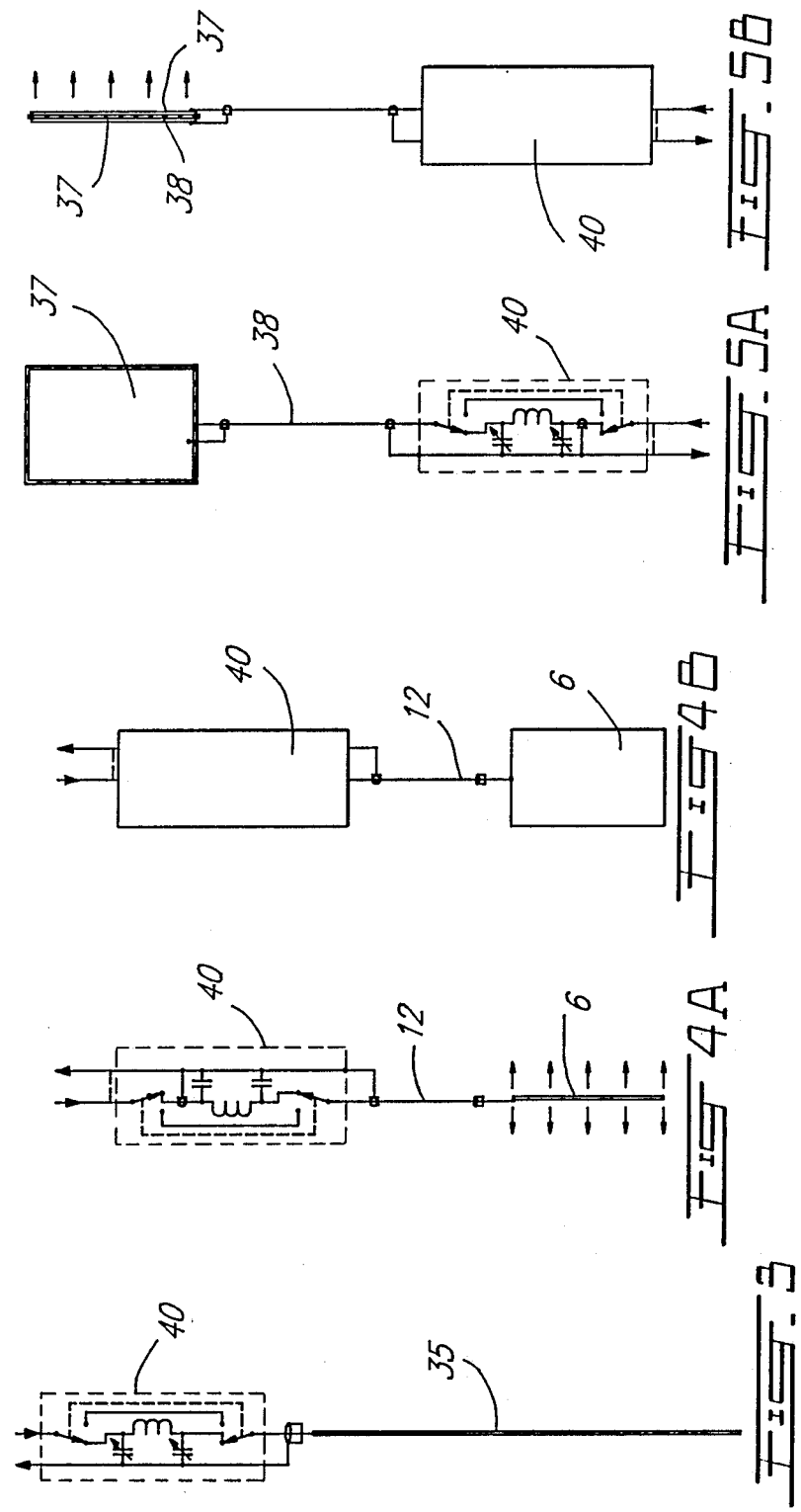

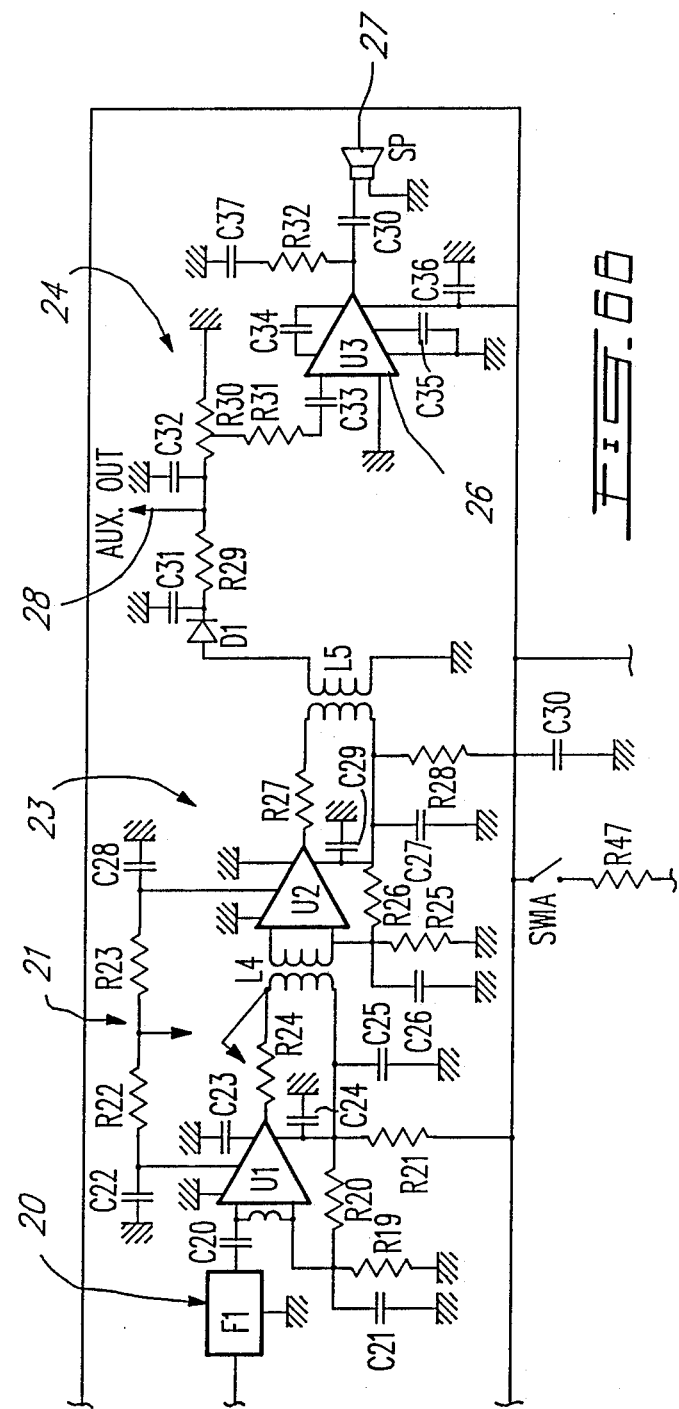

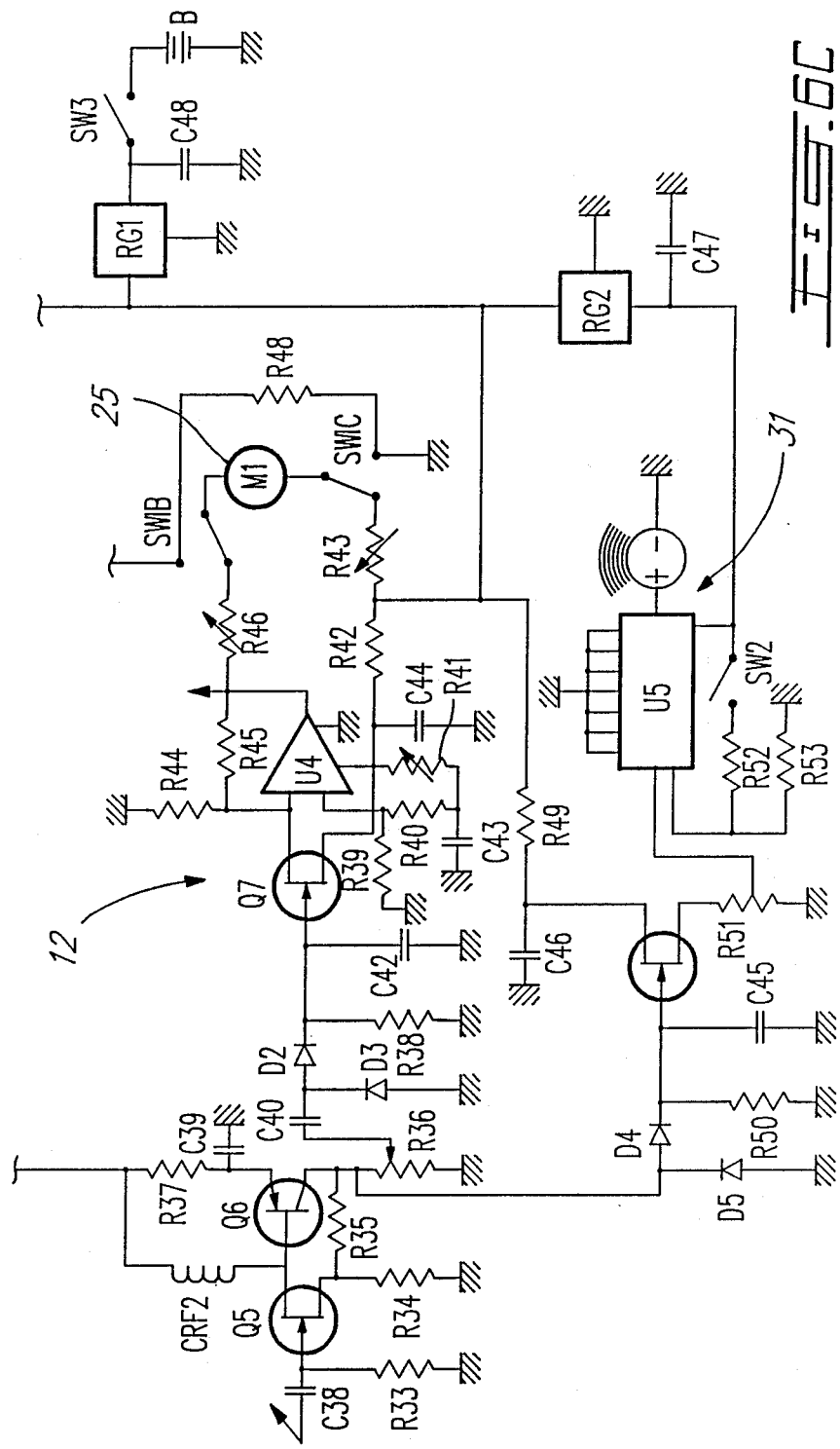

PORTABLE DETECTOR DEVICE FOR DETECTING PARTIAL ELECTRICAL DISCHARGE IN LIVE VOLTAGE DISTRIBUTION CABLES AND/OR EQUIPMENT

BACKGROUND OF INVENTION (a) Field of the Invention

The present invention relates to a portable detector device for detecting partial electrical discharge in live voltage distribution cables and/or equipment located above or below ground (such as in manholes).

(b) Description of Prior Art

Electrical utilities share a keen interest in technological advances that promise better reliability and greater safety of their power transmission and distribution systems. They invest heavily in the evaluation of system components, control and communication equipment, installation and non-destructive measurement techniques in an aim to minimize power outages and the duration of any unavoidable system down time. Service continuity is often difficult to maintain due to existing conditions of cables and joints without jeopardizing the safety of operating personnel required to maintain and repair the distribution lines and equipment.

Electrical utilities are always striving to improve the safety of their personnel working in manholes or above ground on the utilities' extensive distribution network. Therefore, there is a need to provide a simple portable tool for checking the state of cables and joints in manholes or above ground, and that would ensure greater safety to the user and which could evaluate partial discharge levels in cables and joints in normal system operating conditions. Partial discharge measurement represents the most informative non-destructive test of the quality of extruded solid dielectrics, since the presence of such discharges at operating voltage, gives a positive indication of serious problems in the near future.

However, partial discharges are very difficult to measure owing to the need to eliminate extrenuous electromagnetic interference while maintaining the supply of high cable charging current. Balanced bridge circuity using low frequency (0.001 hz) test source is one solution, although it is not as easy to use as a general go or no-go test. There is, therefore, a need to provide a detector device capable of detecting non-electrical signals, in decibals, microvolts, etc. that could be related to partial discharges measured by standard techniques (in microcoulombs).

SUMMARY OF INVENTION

It is a feature of the present invention to provide a portable detector device capable of detecting partial electrical discharge in live voltage distribution cables and/or equipment which is easy to use by maintenance people usually employed by utility companies and which provides a signal or alarm indicative of electrical partial discharge and the magnitude of the discharge, as well as indicating the location of such discharge.

Another feature of the present invention is to provide a portable detector device for detecting partial electrical discharge which provides substantially zero risk of fault whereby personnel can work near live equipment without any fear of electrocution faults.

Another feature of the present invention is to provide a portable detector device for detecting partial electrical discharge in live voltage distribution cables and/or equipment and wherein the device has a selection of detection probes for detecting partial discharge in live distribution cables and equipment located above ground or below ground in a manhole to indicate the presence of faults and the localization of same as well as the magnitude of the faults to determine whether live equipment should be de-energized for the personnel is to work on it or in the vicinity of it.

According to the above features, from a broad aspect, the present invention provides a portable detector device for detecting partial electrical discharge in live VOltage distribution cables and/or equipment. The device comprises a probe secured to an insulated portable means for manual displacement of the probe. A detector circuit is connected to the probe for detecting a partial discharge signal in the range of 5 to 10 MHz emitted by the partial discharge. The detector device has an input attenuator circuit connected to the probe to lower the level of the detected signal to a desired level. Transformation circuit means is provided to change the detected signal to a predetermined frequency signal substantially free of noise and representative of the magnitude of the detected partial discharge signal. Amplifier circuit means is further provided to amplify the predetermined frequency signal. Output circuit means is also provided for generating signals indicative of the presence and magnitude of the partial discharge.

BRIEF DESCRIPTION OF DRAWINGS

A preferred embodiment of the present invention will now be described with reference to the accompanying drawings, in which:

FIG. 1 is a block diagram showing the construction of the portable detector device of the present invention for detecting partial electrical discharge in live voltage distribution networks;

FIG. 2A is a plan view showing the construction of a metal ring-type probe constituting the scanning head of the device;

FIG. 2B is an end view of the ring of FIG. 2A;

FIG. 3 is a schematic view of a omni-directional conductive rod constituting the scanning head of the device of the present invention;

FIG. 4A is a plan view of a metal plate contact probe constituting the scanning head;

FIG. 4B is a side view of FIG. 4A;

FIG. 5A is a plan view of a further uni-directional contact probe constituting the scanning head of the detector device;

FIG. 5B is a side view of FIG. 5A; and

FIGS. 6A-6C show a schematic view showing the construction of the detector circuit which is connected to the scanning head.

DESCRIPTION OF PREFERRED EMBODIMENTS

Figure 6A:
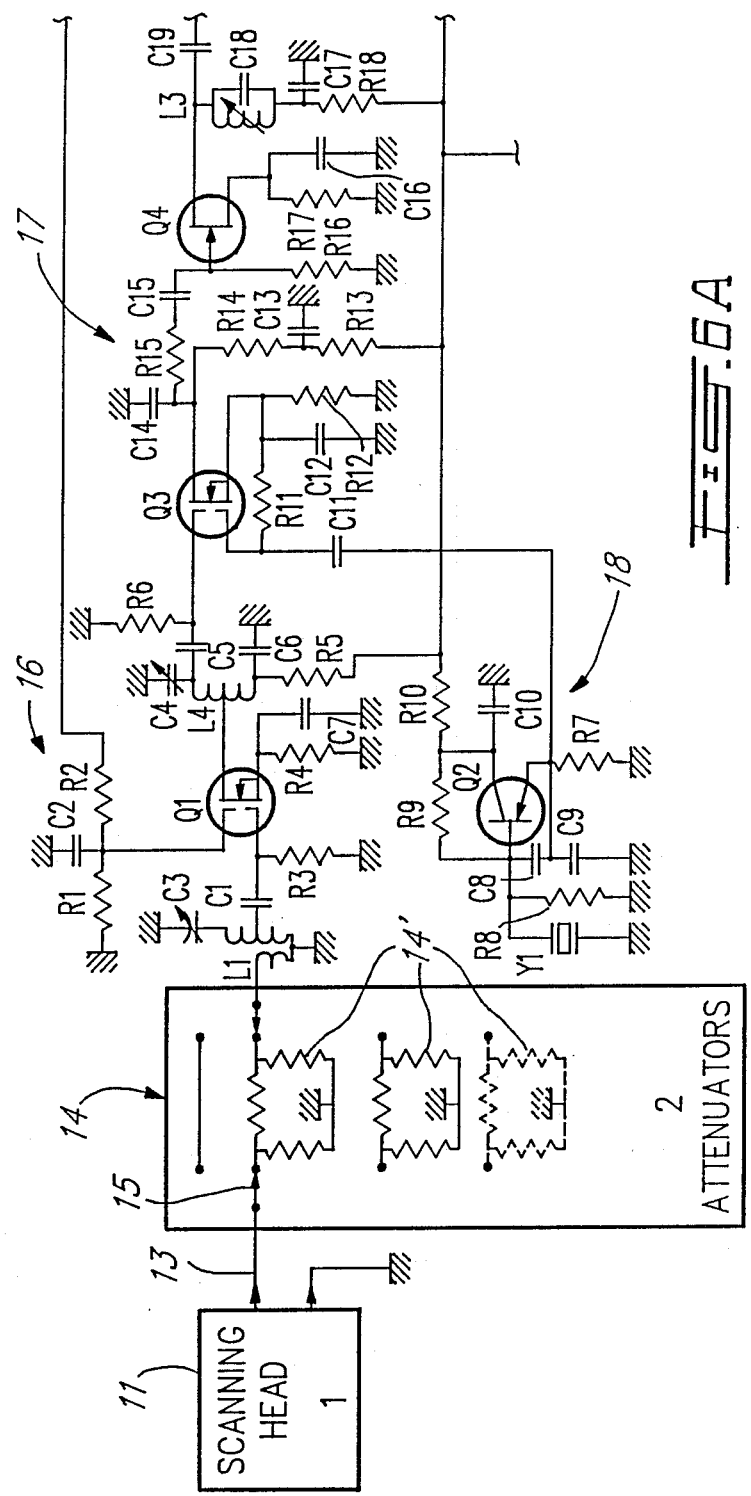

Referring now to FIG. 1, there is shown generally at 10, in block form the construction of the circuitry of the portable detector device of the present invention. The detector is essentially comprised of two sections, and namely, a scanning head 11 constituted by a selected probe, as will be described later, which is manually displaceable by an insulated portable means in relation to a live electrical cable or conductor and/or equipment in order to detect partial electrical discharge therein. The second part of the circuit consists of a portable detector constituted by the circuitry which is connected to the probe 11 and which can be conveniently carried by maintenance personnel in a manner well known to a person skilled in the art. The scanning head 11 is connected to the portable detector through a cable 13.

Tests have shown that partial electrical discharge in cable insulation generates short high frequency current pulses which propagate and produce electromagnetic waves that interfere with receiving radio signals. Therefore, a narrow band RF detector equipped with different electromagnetic probes 11, as will be described later with reference to FIGS. 2-5, offers a suitable means of determining the frequencies and frequency bands that would ensure maximum sensitivity and relatively good selectivity where there was no radio interference and where the energy measure, caused by partial discharge due to the artificial voids in the cable were much greater than the noise level without any discharge. It was noted from experimentation that the frequencies generated by partial discharge were predominated between 0 and 50 MHz. However, the frequencies that had an acceptably low noise level, maximum dynamic range, maximum selectivity and no radio interference, was in the 5 to 10 MHz range. Accordingly, the portable detector 12 was conceived to operate at a selected frequency in this range.

The detector 12 consists essentially of an input attenuator 14 connected to the scanning head 11 through the cable 13. The attenuator 12 provides a plurality of selective attenuating circuits 14' (see FIG. 6) which are selectively connected by a switch 15 whereby to connect the probe 11 to a selected one of the attenuating circuits 14' by the operator. The attenuator is connected to an amplifier circuit 16. Through the attenuator, the operator selects the proper db level of the input signal fed to the amplifier stage 16. It is pointed out that the value of the electromagnetic signals generated by electrical partial discharge is proportional to the magnitude of discharge. Accordingly, this input signal may be brought to a desired lower level by the of the attenuating circuits 14'.

The detector circuit of the present invention is tuned to a selected frequency, herein 7 MHz, and this signal is amplified by amplifier 16 prior to feeding same to a mixer circuit 17.

The mixer circuit 17 acts as a frequency changer in order to generate on its output a known frequency signal of 455 KHz. This frequency signal varies in amplitude only dependent on the magnitude of the partial electrical discharge signal. The output signal of 455 KHz is obtained in the mixer 17 by mixing the detected signal of 7 MHz with a known frequency signal generated by the local oscillator 18. Accordingly, the local oscillator will generate a frequency to subtract from the 7 MHz signal whereby to reproduce the output signal of 455 KHz and preserving the same amplitude ratio as the detected partial discharge signal. This predetermined frequency signal of 455 KHz is then connected by connection 19 to a filter circuit 20.

The filter circuit 20 removes unwanted signals, such as side harmonics, and other noise signals, from the output signal of the mixer prior to feeding same to a 455 KHz amplifier circuit 21 which amplifies the gain of the signal to give the detector more sensitivity. The output 22 of the amplifier 21 feeds another 455 KHz amplifier stage which also amplifies the gain of the signal and feeds same to two output circuits, a first being constituted by a redressing detector circuit 24 and the other by a VU meter 25.

The circuit 24 is schematically illustrated in FIG. 6 and acts as a diode to feed a modified signal to a low frequency amplifier 26 which drives a speaker which produces a signal simulating the detected partial electrical discharge. An auxiliary output 28" is also provided to feed this signal to any auxiliary equipment which monitors the probes which could provide a printout, or other type of information which is obvious to a person skilled in the art.

The output 29 from the amplifier 23 also connects to a meter amplifier 30 which has one of its output 30' connected to the VU meter 25 to provide a read-out of the magnitude of the partial electrical discharge. The other output 30' is connected to an alarm device 31 which sounds an alarm once the partial discharge has exceeded a danger level giving a warning to the operator that the equipment or the voltage being supplied by the cable must be disconnected for his safety.

Referring to FIG. 2A and 2B, there is shown one embodiment of construction of the scanning head or probe 11. As herein shown, the probe consists of a metal ring herein a copper tube 32, having opposed free ends 33 thereof connected by a coaxial cable 12 which is connected to a coupled circuit 40. The coupling circuit is provided with a tuning circuit 42 and a bypass connection 42' selected by a switch 41 and 41' for proper coupling to the detector. An insulating support 34 is also connected to the copper tube to manually position the tube and to sweep it in a plane transverse to an electrical cable. This type of probe is particularly useful for overhead transmission cables.

FIG. 2B is an end view of the copper tube showing its direction of displacement with the small arrows extending substantially parallel to an electrical distribution line.

FIG. 3 illustrates a second type of scanning head and as herein shown, it is constituted by a metallic electrically conductive rod 35 which provides omni-directional detection of partial electrical discharge faults. This rod may be a copper conductive rod and serves primarily for periodic and preventive maintenance of underground distribution networks and gives a general idea of partial discharge activity in a test area, from outside a manhole right up to the cable insulation itself. In fact, it is specially designed to pass through the opening in manhole covers. As shown in FIGS. 4A and 4B, the bi-directional contact probe is constituted by a small metallic copper plate 36 or copper sheet whose surface area and thickness is selected depending on the degree of sensitivy required. The plate is covered with insulating material to prevent direct contact with other metallic parts such as the concentric neutral of the cable under test or other grounded conductors. This copper sheet is preferably used with a J-meter insulating stick (not shown). To determine the location of a partial discharge along a cable or joint, the probe is past gently and slowly over the insulated area and the detector meter is carefully observed to see where the readings reach maximum. This spot marks the source of the partial discharge.

FIGS. 5A and 5B show a further embodiment of the construction of the probe. As herein shown, the probe is a unidirectional contact probe which is formed of a pair of metal plates 37 superimposed and separated by an insulating material 38. With all of the probes as herein described and as shown in FIGS. 2 to 5, these are all provided with a coupling circuit 40 as previously described. It is within the ambit of the present invention to cover any obvious modifications thereof, provided such modifications fall within the scope of the appended claims.

I claim:

1. A portable detector device for detecting partial electrical discharge in live voltage distribution cables and/or equipment, said device comprising a probe secured to an insulated portable means for manual displacement of said probe in the vicinity of said distribution cables and/or equipment, a detector circuit connected to said probe for detecting a partial discharge signal in the range of 5 to 10 MHz emitted by said partial discharge, said detector device having an input attenuator circuit connected to said probe to lower the level of said detected signal to a desired level, transformation circuit means including a mixing circuit for mixing said detected partial discharge signal with a known frequency signal from a local oscillator circuit to change said detected signal to a predetermined frequency signal substantially free of noise and representative of the magnitude of said detected partial discharge signal, amplifier circuit means to amplify said predetermined frequency signal without amplifying any noise in said discharge signal, said amplifier circuit means also dividing said predetermined frequency signal to feed an audio frequency amplifier to provide an output audio signal free of said carrier signal and representative of said detected signal only and further to feed a measuring and alarm circuit means for generating signals indicative of the presence and magnitude of partial discharge.

2. A portable detector device as claimed in claim 1 wherein said input attenuator circuit, is provided with a plurality of attenuating circuit, and switch means to connect said probe to a selected one of said passive attenuating circuits depending on a desired db level signal.

3. A portable detector device as claimed in claim 1 wherein said transformation circuit means also includes a filter circuit to remove unwanted frequency signals associates with said predetermined frequency signal.

4. A portable detector device as claimed in claim 3 wherein there is further provided an amplifier connected between said input attenuator and said mixer circuit to amplify an attenuated output signal at an output of said attenuator and representative of said detected signal.

5. A portable detector device as claimed in claim 4 wherein said amplifier circuit means comprises at least one further amplifier to amplify said predetermined frequency signal to feed said output circuit means.

6. A portable detector device as claimed in claim 2 wherein said probe is a contact probe formed as a metal plate having an insulating coating thereon.

7. A portable detector device as claimed in claim 5 wherein said output circuit means comprises a metering device to indicate the magnitude of said predetermined frequency signal, said predetermined frequency signal having a magnitude proportional to the magnitude of said partial discharge signal detected by said probe.

8. A portable detector device as claimed in claim 7 wherein ther is further provided an audible alarm device associated with said metering device, said audible alarm device indicating an alarm condition relating to said detected signal.

9. A portable detector device as claimed in claim 8 wherein said metering device is a Vu meter fed by an output amplifier, said output amplifier also feeding said audible alarm device.

10. A portable detector device as claimed in claim 2 wherein said probe is a unidirectional contact probe formed of a pair of metal plates superimposed and separated by an insulating material.

11. A portable detector device as claimed in claim 1 wherein said mixer circuit is a frequency converter which produces a predetermined frequency signal of 455 KHz, said detected signal being a 7 MHz signal, said oscillator frequency reducing said 7 MHz signal to said 455 KHz signal and preserving the same amplitude ratio.

12. A portable detector device as claimed in claim 1 wherein said input attenuator circuit is connected to said probe through a shielded cable.

13. A portable detector device as claimed in claim 2 wherein said probe is constituted by a metal ring, said metal ring being disposed substantially perpendicular to distribution cables and moved therealong to detect partial electrical discharge faults.

14. A portable detector device as claimed in claim 2 wherein said probe is a metallic electrically conductive rod, said rod providing omnidirectional detection of partial electrical discharge faults.

* * * * *